United States Patent [19]

Falckenberg et al.

[11] Patent Number: 4,599,244
[45] Date of Patent: Jul. 8, 1986

[54] METHOD LARGE-AREA SILICON BODIES

[75] Inventors: Richard Falckenberg, Wald; Christa Grabmaier; Josef Grabmaier, both of Berg, all of Fed. Rep. of Germany

[73] Assignee: Siemens Aktiengesellschaft, Berlin & Munich, Fed. Rep. of Germany

[21] Appl. No.: 649,658

[22] Filed: Sep. 12, 1984

Related U.S. Application Data

[63] Continuation of Ser. No. 629,677, Jul. 11, 1984, abandoned.

[51] Int. Cl.$^4$ .......................... B05D 5/12; B05D 3/02; H01L 31/00
[52] U.S. Cl. .......................... 427/74; 118/718; 118/725; 136/258; 156/607; 156/DIG. 84; 156/DIG. 88; 422/254; 427/86; 427/374.3
[58] Field of Search ................ 118/718, 725; 156/607, 156/DIG. 84, DIG. 88; 422/254; 427/74, 86, 85, 374.3; 136/258

[56] References Cited

U.S. PATENT DOCUMENTS 4,305,776 12/1981 Grabmaier .......................... 156/605
4,330,358 5/1982 Grabmaier et al. .................. 156/603
4,357,200 11/1982 Grabmaier .......................... 156/603
4,357,201 11/1982 Grabmaier et al. .................. 156/603

FOREIGN PATENT DOCUMENTS

P3231326.8 8/1982 Fed. Rep. of Germany .

Primary Examiner—Michael R. Lusignan
Attorney, Agent, or Firm—Hill, Van Santen, Steadman & Simpson

[57] ABSTRACT

A method and an apparatus is provided for the manufacture of large-area silicon crystal bodies useful for solar cells. A carrier member consisting of a net-like graphite fabric or quartz fabric is moved horizontally through a heater arrangement carrying silicon plates on its surface which are matched to the dimensions of the carrier member. The silicon body is caused to melt and the molten silicon fills in the meshes of the net after which crystallization is induced. Meshes having dimensions up to about 10 mm × 10 mm are thus filled with silicon. The technique involves low production costs and high product crystal quality and serves for the continuous manufacture of silicon ribbons for solar cells.

18 Claims, 4 Drawing Figures

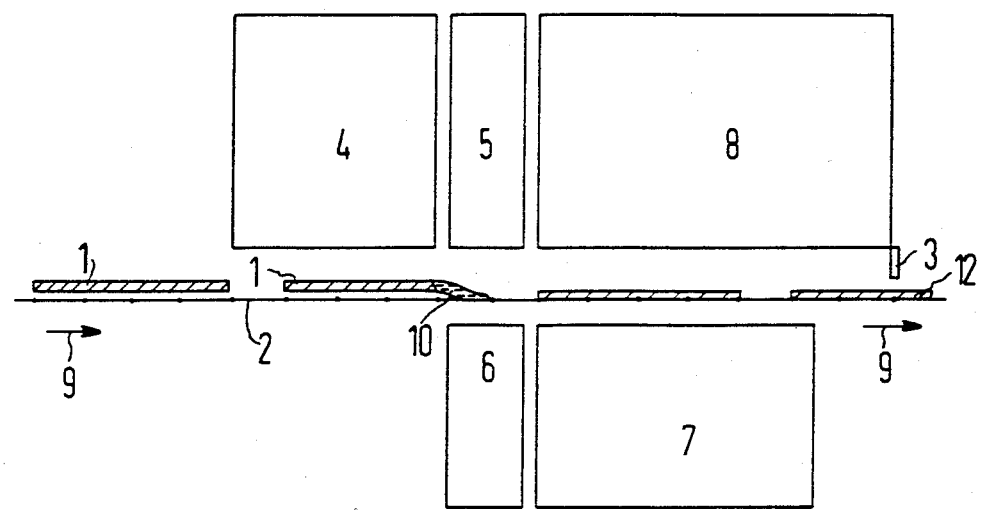
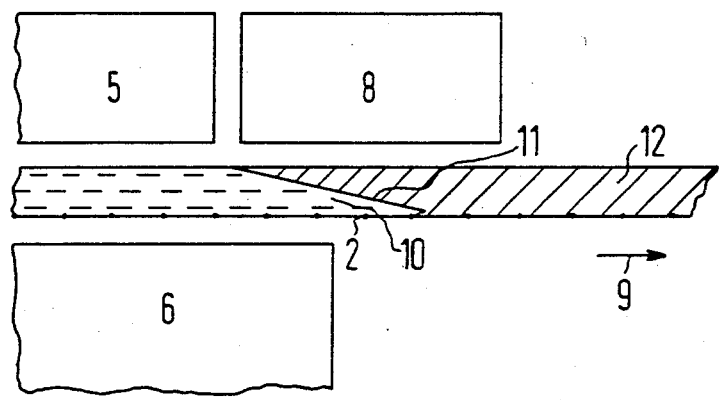
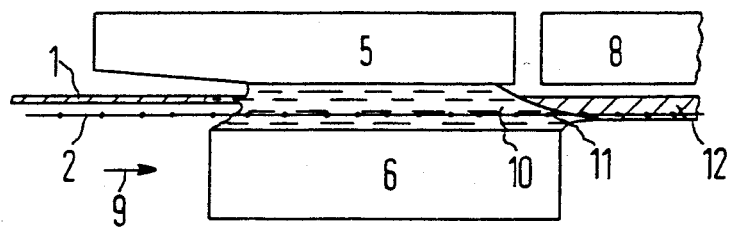

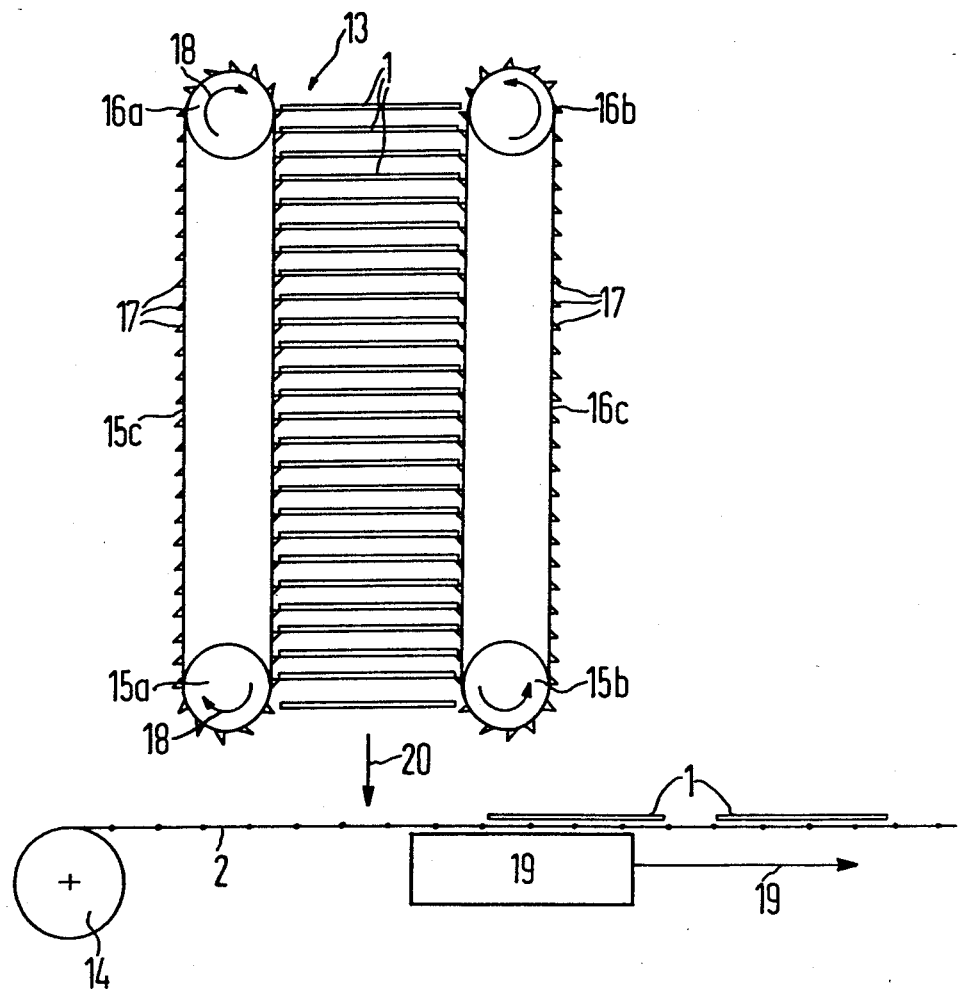

METHOD LARGE-AREA SILICON BODIES

RELATED APPLICATION

This application is a continuation of our earlier filed U.S. patent application Ser. No. 629,677 filed July 11, 1984, now abandoned, the disclosure and contents of which are incorporated herein by reference.

BACKGROUND OF THE INVENTION

1. Field of the Invention

This invention lies in the field of production techniques for silicon bodies, particularly polycrystalline large-area silicon bodies such as are useful for further processing into solar cells.

2. Prior Art

The cheapest silicon possible should be employed for the manufacture of solar cells from silicon since the demands made of these components with respect to crystal quality are not as high as in the case of semiconductor elements employable for integrated circuits. A way was therefore to be found for manufacaturing silicon crystals in a simple and inexpensive manner, i.e. without material losses insofar as possible.

A method of the type just cited is disclosed in the DE-OS No. 28 50 805. Planar silicon with a high throughput (1 m/min) can be produced for solar cells with this method in that a carrier member comprised of graphite which is provided with holes is tangentially drawn across the surface of a silicon melt in a throughfeed process, whereby the carrier member is integrated in the produced silicon bodies upon crystallization of the silicon. A disadvantage of this method is that convectional currents can occur in the melt.

A further improvement with respect to the crystal quality is achieved when, as proposed in the [German] patent application No. 32 31 326.8, the molten silicon is supplied to the carrier member by means of capillaries. The capillaries discharge into a horizontal gap through which a carrier member is drawn for coating. Such carrier member consists of graphite threads and has a net-like structure. Given this drawing apparatus, the melt level in the silicon reservoir lies 10 to 15 mm lower than the horizontal gap for technical reasons. The consequence thereof is that a hydrostatic pressure $p \cdot g \cdot h$ acts on the silicon melt which is picked up and entrained by the meshes of the carrier member, whereby $h=10$ through 15 mm, $\rho=$the density of silicon, $g=$gravity, thus limiting the maximally fillable mesh size dimenstions to about 5 mm$\times$5 mm.

BRIEF SUMMARY OF THE INVENTION

The present invention relates to a method for the manufacture of polycrystalline, large-area silicon bodies, such as are particularly employed for further processing into solar cells, by means of coating a carrier member which is resistent to molten silicon, but which is wettable by a silicon melt. The carrier member comprises a net-like structure. The invention also relates to an apparatus for the implementation of such method.

A principal object of this invention is to manufacture a planar silicon body in a tape or ribbon form with a crystal quality at least sufficing for solar cells. In such manufacture, a graphite net or a graphitized silica glass (quartz) net having mesh dimensions up to of about 10 mm$\times$10 mm (100mm$^2$) can be unproblematically employed as carrier member for such a coating. A further object of the invention is to produce silicon crystal bodies which are as large-area and as uniform as possible with respect to the coating using the most cost-favorable initial material. A further object is to provide an apparatus for use in such manufacture which is simply constructed and permits a high throughput.

In order to achieve the inventive objects, a method of the type initially cited is provided which is characterized in that the carrier net member existing in tape or ribbon form is brought into contact with a succession of silicon bodies each consisting of silicon crystal grains of small size. Such an individual silicon body exists in a sheet or a plate form and generally coincides with the carrier member with respect to its dimensions. An assembly of carrier members and silicon bodies is exposed horizontally to a heater arrangement so that each silicon body is generally planarly disposed upon the carrier member and is caused to melt. The silicon melt is deposited in the meshes of the carrier net and is induced to crystallize.

It lies within the scope of the invention that a suitable starting silicon plate (or sheet) can be produced by means of sintering silicon powder. Also, a starting silicon plate (or sheet) can be manufactured by means of spraying molten silicon onto a cooled drum can. The mesh dimensions of the carrier member consisting of a graphite thread net, or a graphitized silica glass thread net, can range up to about 10 mm$\times$10 mm (100 mm$^2$).

Provided for the implementation of the inventive method is an apparatus which is characterized by the following features:

(a) a horizontally disposed heater arrangement consisting of a plurality of separately regulatable heating zones, (b) a conveyor apparatus including conveyor drive means which moves a carrier ribbon horizontally through the heater arrangement, (c) a carrier ribbon supply drum means disposed in front of the heater arrangement from which a tape-configured carrier member is unwound, (d) a storage drum means disposed after the heater arrangement on which the product coated carrier member is taken up, and (e) a silicon plate feeder means disposed in front of the heater arrangement and above the supply drum including silicon plates storage means, and including a feeder drive means, said feeder means being adapted to supply silicon plates upon the carrier member in a time-controlled sequence.

Other and further objects, aims, purposes, features and advantages, aspects, embodiments, and the like will be apparent from the teachings of the present specification taken with the attached drawings and claims.

BRIEF DESCRIPTION OF DRAWINGS

In the drawings:

FIG. 1 is a schematic side elevational view of a heater arrangement used in the apparatus for this invention;

FIG. 2 is a schematic detailed view of the melting and crystallizing regions of the heater arrangement of FIG. 1;

FIG. 3 is a view similar to FIG. 2, but illustrating an alternative arrangement; and FIG. 4 is a schematic side elevational view of a feeder means suitable for apparatus of this invention.

DETAILED DESCRIPTION

The process of this invention can be practiced batchwise or continuously.

A continuous rush of practice is herein preferred and is no described. Referring to FIG. 1, a plurality of individual planar silicon bodies 1 are initially situated in a magazine or tray stack of a feeder means 13 (shown in FIG. 4). Each body or plate 1 consists of sintered or sprayed silicon and each plate is successively laid down in registration with a continuously moving carrier belt member 2 consisting of a net formed of graphite thread or of a net formed of graphitized silica glass thread. The assembly of belt 2 and bodies 1 thereon moves horizontally through a heater arrangement in which the silicon is caused to melt in a zone or region 10, and to disperse into the meshes of the net of carrier member 2. The resulting composite or coated carrier is conveyed past an output gap 3. The heater arrangement itself comprises a plurality of separately regulatable furnaces or heaters, such as 4, 5, 6, and 7. A pre-heating each silicon plate 1 is accomplished by furnace 4 before the melting region 10, a post-meet heating is accomplished by furnace 7 after the composite passes out of the melting region 10. Melting region 10 is here provided by melting furnaces 5 and 6 located in opposed relationship to one another above plates 1 and below carrier 2, respectively.

A crystallization of the molten silicon in the meshes of the carrier member 2 is promoted by a cooling means 8. An integrated composite crystallized silicon and graphite net structure 12 results. The arrows 9 indicate the conveying direction. Given, for example, individual mesh width and length dimensions of about 10 mm by 10 mm, a conveying speed is conveniently set at a value of about 50 cm/min, for example.

The single-sided pre-heating by furnace 4 of each silicon sheet 1 is conveniently accomplished by an average temperature of about 1200° C., for example, and is intended to prevent the graphite thread net of carrier 2 from remaining at a high temperature for an unnecessarily long time which possibly could result in the undesired emission of contaminants.

A controlled solidification of the silicon melt in meshes of carrier 2 is promoted by means of an afterheating by furnace 7 from below carrier 2 at a mean temperature of from about 1000° to 1400° C. Simultaneously from above a cooling of the composite is provided by cooling means 8. The thickness of the silicon melt achieved in the carrier member 2 is thereby inversely proportional to the mesh width of the carrier member 2, that is, the crystallized silicon tape 12 becomes thinner as the individual mesh perimeter dimensions increase. Given individual mesh width and length dimensions of about 5 mm by 5 mm, for example, the thickness of an integrated composite crystallized silicon/graphite net structure 12 lies below about 1 mm.

Referring to FIG. 2, detail of the transition from the silicon melt region 10 into the integrated crystallized silicon graphite net structure 12 is seen. The same reference characters apply as in FIG. 1, but the after-heating zone provided by furnace 7 as well as the pre-heating zone provided by furnace 4 are not shown in the drawing. The crystallization front or zone is referenced by the numeral 11.

Referring to FIG. 3, there is seen a modification of the apparatus as shown in FIG. 2 which modification is particularly suitable for the manufacture of flat silicon tapes. Here, the furnaces or heaters 5 and 6 simultaneously serve for melting the individual silicon sheets 1 and for shaping the resulting integrated structure 12. The pre-heating furnace 4 as well as the gap 3 have not been shown here for the sake of greater clarity.

Given manufacture of planar silicon integrated with net-like carrier member in a tape or sheet form according to the teachings of the invention, a carrier 2 can have mesh width and length dimensions of up to about 10 mm by 10 mm each (100 mm$^2$). Larger mesh sizes within this range have the following advantages:

1. A large net width means low substrate costs.
2. The horizontal supplying of the silicon plates upon the carrier net results in the hydro-static pressure $p \cdot g \cdot h$ playing no role in the filling of the individual meshes because $h \simeq 0$.
3. Due to the substrate material employed, the silicon body which is crystallized in the meshes contains only a low contaminant level.
4. The arrangement of the heating zones in the apparatus can be made so as to supply a high crystal quality in the product integrated structure.

The advantages revealed under points 3 and 4 (above) have a very beneficial effect on the efficiency of the solar cells produced from these product integrated structures (approximately 12%).

Referring to FIG. 4, details of a feeder arrangement for successively depositing individual silicon plates 1 upon carrier member 2 are shown. For the sake of greater clarity, the individual heaters of the heater arrangement are omitted. The same reference characters as in FIGS. 1 through 3 apply and the arrow 19 indicates the conveyor apparatus (not detailed) used for moving carrier (2).

The silicon plates 1 are expediently manufactured by sintering according to the method disclosed in the DE-OS No. 29 27 086. The initial material is silicon power having individual granule sizes of less than about 1 mm. This silicon powder is stirred into a slip with a bonding agent and the slip is drawn out to a film on a foundation with a drawing shoe. The film is dried and the foundation is removed. The film is then cut to a size which corresponds to the dimensions of an individual solar cell (for example, 10 cm×10 cm), taking the shrinkage during sintering into consideration. The pre-sintering of the film which leads to production of self-supporting plates 1 ensues at temperatures between about 1250° C. and 1300° C. Since a self-supporting, compressed sheet or film can already by employed, the temperature management is thereby of subordinate significance.

As can be seen from FIG. 4, the individual sintered silicon plates 1 are stacked one above the other in a tray-like manner in the feeder means 13. As the carrier member 2 continuously travels in the direction shown by arrow 20 beneath the feeder means 13 by means of a conveyor means 19 (not detailed in the drawing), the individual silicon sheets 1 are deposited thereon sequentially at desired intervals, as shown, for example, in FIG. 4. Alternatively, the sheets 1 can extend continuously on carrier member 2. The carrier member 2 consisting of a belt or tape or ribbon-configured graphite net which is unwound horizontally from a supply drum or reel 14 before silicon plates 1 are laid thereon, and the resulting heat treated and crystallized composite structure can be rewound onto a storage drum (not shown) after it has been prepared according to the invention. The feeder means 13 itself consists of two pairs of rollers 15 and 16 disposed in spaced, parallel relationship relative to one another, whereby two respective rollers 15a and 16a, and 15b and 16b, each disposed one above another respectively, are provided with an endlessly circulating conveyor belt 15c and 16c (similar to a two-sided conveyor belt). Naps or teeth 17 are situated upstandingly at longitudinally spaced intervals on the surface of each endless belt 15c and 16c and serve as a seating surface or platform for supporting the individual silicon sheets 1. The roller pairs 15a, 16a, and 15b, 16b, are placed in synchronized motion by means of a drive (not detailed) indicated by the arrows 18 in the FIG. 4 so that a carrier member 2 consisting of a graphite net has deposited thereon the individual silicon sheets 1 at specific intervals under time control and the so equipped carrier member 2 is continuously supplied to the heater arrangement in the direction of arrow 19. After the crystallization of the molten silicon in the meshes of the carrier 2 individual solar cells are then obtainable by means of simple severing of the product composite tape.

Although various minor modifications may be suggested by those versed in the art, it should be understood that we wish to embody within the scope of the patent warranted hereon all such modifications as reasonably and properly come within the scope of our contribution to the art.

We claim:

1. A method for manufacture of polycrystalline, large-area silicon bodies adapted for further processing into solar cells, said method comprising the sequented steps of:
   (a) depositing on surface portions of a horizontally oriented net-like structure preformed silicon in a plate-like form, said net-like structure being
      (a) resistant to molten silicon, and
      (b) wettable by molten silicon,
   (b) heating the resulting assembly of said net-like structure and said preformed silicon to a temperature sufficient to melt said silicon, and
   (c) crystallizing the resulting melted silicon in said net-like structure.

2. The method of claim 1 wherein said net-like structure is in the form of a ribbon.

3. The method of claim 2 wherein said plate-like silicon forms comprise a plurality of individual flat bodies of similar respective perimeter dimensions which are prechosen to coincide generally with prechosen areas of said ribbon, and
   (a) said ribbon is continuously moved horizontally,
   (b) said flat bodies are sequentially deposited upon said ribbon,
   (c) such resulting assembly of said ribbon and said flat bodies travels through a zone wherein said heating occurs, and
   (d) such resulting composite with said molten silicon dispersed in mesh portions of said ribbon travels through another zone wherein said crystallizing occurs.

4. The method of claim 3 wherein each said flat body is preliminarily produced by sintering silicon powder.

5. The method of claim 2 wherein said plate-like silicon forms are preliminarily produced by spraying molten silicone onto a cooled drum.

6. The method of claim 1 wherein said net-like structure has individual mesh sizes each ranging up to about 100 mm$^2$.

7. The method of claim 3 wherein said ribbon has individual mesh sizes whose length and width dimensions range up to about 10 mm by 10 mm each.

8. The method of claim 3 wherein said heating zone, a plurality of successive subzones relative to the direction of travel of said ribbon and subzones are provided, a first of said subzones being a silicon preheating zone, and a second of said subzones being a silicon melting zone.

9. The method of claim 8 wherein, in said first subzone, said flat bodies are heated from above only.

10. The method of claim 8 wherein, after said second subzone, such resulting composite is subject to said crystallizing, and, during said crystallizing, such composite is simultaneously heated from below and cooled from above.

11. The method of claim 3 wherein said ribbon is comprised of a net formed of graphite thread.

12. The method of claim 3 wherin said ribbon is comprised of a net formed of graphitized silica glass thread.

13. A continuous process for making polycrystalline large-area silicon bodies adapted for processing into solar cells comprising:
   (a) continuously moving a ribbon having a net-like structure wherein individual mesh sizes range up to about 100 mm$^2$ each and which is comprised of a material selected from the group consisting of graphite thread and graphitized silica glass thread, said ribbon being horizontally oriented, said moving extending successively through each of:
      (1) a silicon loading zone,
      (2) a silicon heating zone, and
      (3) a silicon cooling zone,
   (b) in said loading zone, successively depositing along and upon said ribbon individual preformed plate-like forms of silicon in predetermined locations,
   (c) in said heating zone, successively preheating said silicon forms from above and then heating the assembly of said silicon forms and said ribbon to a temperature sufficient to melt said silicon, and
   (d) in said cooling zone, crystallizing said molten silicon in mesh portions of said ribbon while simultaneously heating from below and cooling from above.

14. The process of claim 13 wherein said preheating is carried out at an average temperature of about 1200° C.

15. The process of claim 13 wherein said heating is carried out at a mean temperature of from about 1000° to 1400° C. applied from below.

16. Apparatus for continuously making polycrystalline large-area silicon bodies adapted for further processing into solar cells comprising:
   (a) conveying means for moving continuously a net-like carrier ribbon along a horizontal path,
   (b) feeder means for holding, positioning and depositing in a sequented manner a plurality of plate-like silicon bodies upon the upper surface of said carrier ribbon with individual said silicon bodies being in longitudinally predetermined adjacent relationship to one another,
   (c) heater means located along said horizontal path and downstream of said feeder means relative to the direction of movement of said carrier ribbon, for melting said plate-like bodies, and
   (d) silicon crystallization means located along said horizontal path and downstream of said heater means relative to said direction of movement including heating means for selectively applying heat to lower surface portions of the resulting combination of said melted silicon and said carrier ribbon and further including cooling means for simultaneously applying cold to upper surface portions of said resulting combination.

17. The apparatus of claim 16 wherein said feeder means is disposed over said horizontal path and comprises:
(a) a pair of endless belts, including roller means for supporting and guiding each belt,
(b) an elongated surface region of each belt being in spaced, parallel, generally vertically oriented opposed relationship to the other thereof, and being located over said horizontal path,
(c) each belt including a plurality of outwardly projecting nap means for seating in cooperation with corresponding nap means on the opposing belt individual ones of said plate-like bodies whereby members of said plate-like body plurality are supportable in spaced, parallel relationship to each other over said horizontal path,
(d) drive means including timing control means for continuously moving said pair of endless belts so that said opposed elongated surface regions thereof travel downwards to a position in spaced adjacent relationship to said carrier ribbon before reversing direction of movement whereby individual ones for said plate-like bodies are deposited sequentially and in predetermined relationship to one another on said carrier ribbon.

18. The apparatus of claim 16 wherein said heater means includes:
(a) preheater means for selectively first applying a first predetermined temperature to the upper faces of said plate-like bodies so deposited on said carrier, and
(b) melting means for selectively secondly applying a second predetermined temperature to lower surface portions of said carrier ribbon.

* * * * *